(12) United States Patent
McClure

(10) Patent No.: US 6,603,338 B1
(45) Date of Patent: *Aug. 5, 2003

(54) DEVICE AND METHOD FOR ADDRESS INPUT BUFFERING

(75) Inventor: David C. McClure, Carrollton, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/183,593

(22) Filed: Oct. 30, 1998

(51) Int. Cl.[7] ................................................ H03K 3/017
(52) U.S. Cl. ...................... 327/172; 327/34; 327/379
(58) Field of Search .......................... 327/24, 26, 34, 327/36, 172, 379, 384, 385, 173, 175, 176, 299, 298; 365/230.08, 233.5

(56) References Cited

U.S. PATENT DOCUMENTS

| | | | |
|---|---|---|---|
| 3,641,370 A | 2/1972 | Heimbigner | 307/269 |
| 4,320,515 A | 3/1982 | Burton, Jr. | 375/215 |
| 4,525,635 A | 6/1985 | Gillberg | 307/247 |
| 4,657,123 A | 4/1987 | Sakakiyama | 192/3.58 |
| 4,757,214 A | 7/1988 | Kobayashi | 307/265 |
| 4,825,102 A | 4/1989 | Iwasawa et al. | 307/296.5 |
| 4,843,596 A * | 6/1989 | Miyatake et al. | 365/233.5 |
| 4,877,980 A | 10/1989 | Kubinec | 327/110 |
| 5,124,584 A | 6/1992 | McClure | 307/480 |
| 5,289,060 A | 2/1994 | Elnashar et al. | 307/520 |
| 5,301,165 A * | 4/1994 | Ciraula et al. | 365/233.5 |
| 5,357,480 A * | 10/1994 | Vinal | 326/93 |
| 5,448,529 A * | 9/1995 | Reddy et al. | 365/233.5 |
| 5,493,532 A | 2/1996 | McClure | 365/201 |
| 5,493,537 A | 2/1996 | McClure | 365/233.5 |
| 5,598,095 A | 1/1997 | Schnaitter | 323/315 |
| 5,696,463 A | 12/1997 | Kwon | 327/172 |
| 5,732,032 A | 3/1998 | Park et al. | 365/201 |
| 5,760,612 A | 6/1998 | Ramirez | 327/34 |
| 5,815,016 A | 9/1998 | Erickson | 327/158 |
| 5,955,906 A | 9/1999 | Yamaguchi | 327/259 |
| 6,073,246 A | 6/2000 | Song et al. | 713/401 |

* cited by examiner

Primary Examiner—Terry D. Cunningham
Assistant Examiner—Quan Tra
(74) Attorney, Agent, or Firm—Lisa K. Jorgenson; Andre Szuwalski

(57) ABSTRACT

A substantially noise-free address input buffer for an asynchronous device, such as a static random access memory (SRAM). The input buffer generates both a logical true and complement representation of an address input signal and includes timing circuitry to place the logical true and complement signals in the same deasserting logical state for a predetermined period of time prior to asserting either the logical true signal or the logical complement signal, in response to a signal edge transition appearing on the address input signal. The input buffer further includes edge transition detection (ETD) circuitry for generating an initialization signal in response to the generation of the logical true and complement signals.

25 Claims, 3 Drawing Sheets

DEVICE AND METHOD FOR ADDRESS INPUT BUFFERING

CROSS REFERENCE TO RELATED APPLICATION

The present invention is related to patent application entitled "Device and Method for Data Input Buffering", filed Oct. 30, 1998, as Ser. No. 09/183,595, now U.S. Pat. No. 6,294,939.

BACKGROUND OF THE INVENTION

1. Technical Field of the Invention

The present invention relates to an address input buffer, and particularly to an address input buffer device for a random access memory (RAM) device.

2. Background of the Invention

Semiconductor memories, such as random access memories (RAMs) and read-only memories (ROMs), are typically designed synchronous (clocked) or an asynchronous (unclocked) manner. One type of integrated circuit which operates primarily on asynchronous signals is a static random-access memory (SRAM). An SRAM device is designed to receive address values at address terminals, and to statically provide read or write access to memory cells corresponding to the value of the address applied thereto, without relying on a clock signal indicating that the value at its address terminals is valid.

Many modern SRAMs now include edge transition detection (ETD) circuits and other timing and control circuits that provide the SRAM device with performance benefits of internal dynamic operation. An ETD circuit detects transitions within the device and generates internal signals or "pulses" responsive to detecting such transitions. The internally-generated ETD pulses are employed to initialize the SRAM for commencement of a memory read or write cycle.

For example, the use of an ETD circuit allows the SRAM circuit to perform certain internal operations, such as precharging bit lines or deselecting sense amplifiers, after detection of the address transition but before the decoders access the desired cell. Upon presentation of a new memory address to the SRAM, the transitions at the address terminal cause the ETD circuit to enable the necessary functions of the SRAM to access the memory cells selected by the new memory address. An example of an ETD circuit used in SRAMs is described in U.S. Pat. No. 5,124,584, issued on Jun. 23, 1993, assigned to SGS-Thomson Microelectronics and herein incorporated by reference.

Conventional ETD circuitry is not without its shortcomings. For instance, an ETD pulse generated by the ETD circuitry which is utilized to initialize an SRAM device may possess a pulsewidth which is drastically reduced and in some cases eliminated due to input glitches appearing on the address input bus. In addition, ETD circuitry is typically separate and distinct from address input buffer and address decode logic, thereby increasing silicon layout overhead.

Noise or other interference may appear on an input address bus coupled to an SRAM device which may unexpectantly place the input address bus in an undesirable logic state for a temporary period of time. A noise glitch appearing on an input address bus of an SRAM device may propagate through the SRAM address decode circuitry thereof and cause the selection of a false address in which the wrong word line of the SRAM device is asserted. A false address selection may cause data stored in the memory cells associated with the wrong word line to be irretrievably lost.

Accordingly, there is a need for an input address buffer device and method for an SRAM for preventing noise appearing on an address input bus from generating a false address selection and for generating edge transition detection signals with little overhead.

SUMMARY OF THE INVENTION

The present invention overcomes shortcomings associated with asynchronous devices and satisfies a need for an input buffer circuit which substantially eliminates the adverse effects of noise and efficiently generates ETD signals for initializing an SRAM or other asynchronous device.

According to the present invention, there is provided an address input buffer device and method for an asynchronous device, such as an SRAM. The address input buffer device preferably receives an input address bus and generates logic true and logic complement output signals representative thereof for use by decoding and other circuitry to which the address input buffer device is coupled, such as row and column decoder circuitry for the SRAM device. In order to prevent the occurrence of false address selection in the corresponding asynchronous SRAM device, the address input buffer circuit preferably includes timing circuitry to first place both of the logic true and complement output signals in a deselected state (i.e., a logic state in which neither the logic true nor logic complement output signals enables an activity within the SRAM device, such as the assertion of a word line). Following a predetermined period of time in which the logic true and complement output signals are in the deselected state, the appropriate one of the logic true and complement output signals transitions to the selected state to enable an activity within the SRAM device.

The above-mentioned timing circuitry of the address input buffer device is efficiently utilized to additionally detect an edge transition appearing on the address input bus and generate an edge transition detection pulse to initialize the SRAM device for preparation of a new memory cycle, such as a memory read or write operation. By generating the edge transition detection pulse from the timing circuitry that generates the logic true and complement signal representations of the input address bus, a relatively sizeable amount of silicon space is saved.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE PREFERRED EMBODIMENT

Figure 1:
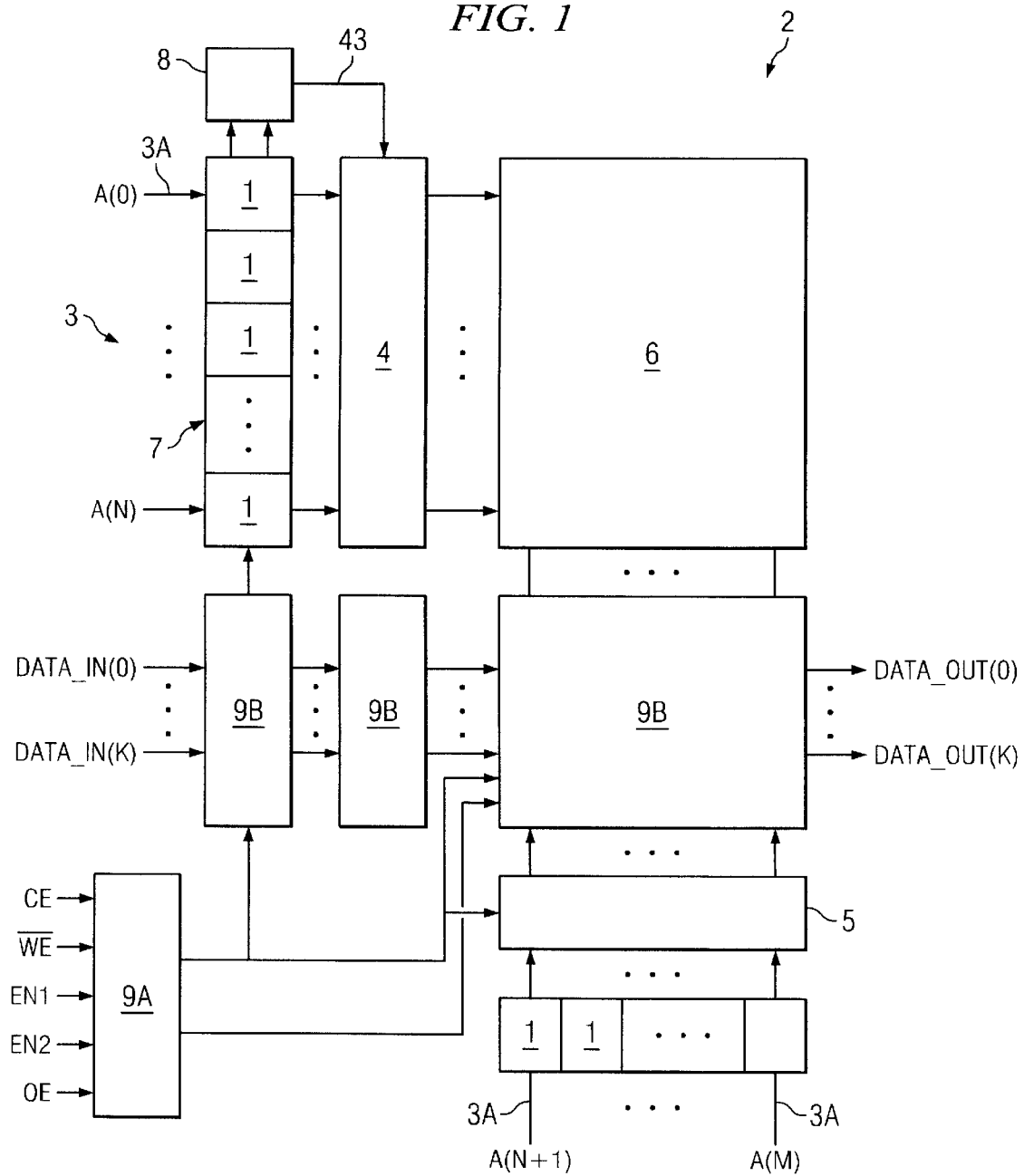
FIG. 1 is a block diagram of the present invention in conjunction with an SRAM device.

Referring to FIGS. 1–4, there is shown an address input buffer 1 circuit in accordance with a preferred embodiment of the present invention. Address input buffer 1 is suitably employed in an asynchronous device, such as an asynchronous static random access memory (SRAM) device 2 asshown in FIG. 1. In this context, address input buffer 1 receives an address bus 3, conditions the address bus 3 and generates necessary signals that can be decoded by row decoder 4 and column decoder 5 for use in accessing memory cells in memory array 4. SRAM device 2 may additionally include memory control circuitry 9A and data input-output circuitry 9B. As shown in FIG. 1, a number of address input buffers 1 may be combined in a group 7 in order to provide suitable buffering for each bit of address bus 3. It is understood that address input buffer 1 is shown in association with an SRAM device for exemplary purposes only, and that address buffer 1 may be used in other asynchronous devices as well.

Address input buffer 1 generates both a true and complement signal representation of an address input bit 3A for use by decoding logic. Address input buffer output signal out_true 10 (FIG. 2) is a boolean true representation of address input bit 3A and output signal out_comp 11 is a boolean complement representation thereof.

Address input buffer 1 preferably includes circuitry to avoid a false address from being selected or otherwise propagated throughout the device with which address input buffer 1 is associated. For use in an SRAM device, a small glitch appearing on address input bit 3A may result in a glitch appearing on one or more wordlines of the SRAM device, thereby resulting in data potentially being corrupted. Accordingly, address input buffer 1 includes timing circuitry 13 for providing glitch tolerant output signals out_true 10 and out_comp 11.

Timing circuitry 13 preferably prevents a false address from appearing on output signals out_true 10 and out_comp 11 by initially forcing output signals out_true 10 and out_comp 11 into a deselected condition, i.e., a condition under which neither out_true 10 nor out_comp 11 is in a logic state to enable an activity, in response to address input bit 3A changing a logic state. Circuitry 13 preferably maintains output signals out_true 10 and out_comp 11 in a deselected condition for a period of time that is greater than an expected glitch pulse width appearing on address input bit 3A. As a result, a glitch appearing on address input bit 3A will disappear prior to either output signal out_true 10 or out_comp 11 transitioning into an asserted condition to enable an activity. By controlling the timing associated with asserting output signals out_true 10 and out_comp 11 to enable an activity and in particular decoupling the asserting edge transition of the output signals from the deasserting edge transition thereof so that the asserting edge transition occurs at a time period after the deasserting signal edge transition, noise glitches or other race conditions are substantially prevented from propagating throughout an asynchronous device. This timing control ensures, for example, that all wordlines in SRAM 2 are deasserted well before the selected wordline is asserted.

Circuit 13 preferably employs dual signal paths 14 and 15 for generating output signals out_true 10 and out_comp 11, respectively. Signal paths 14 and 15 preferably employ substantially identical circuits and have substantially identical time delays therethrough.

Figure 3:
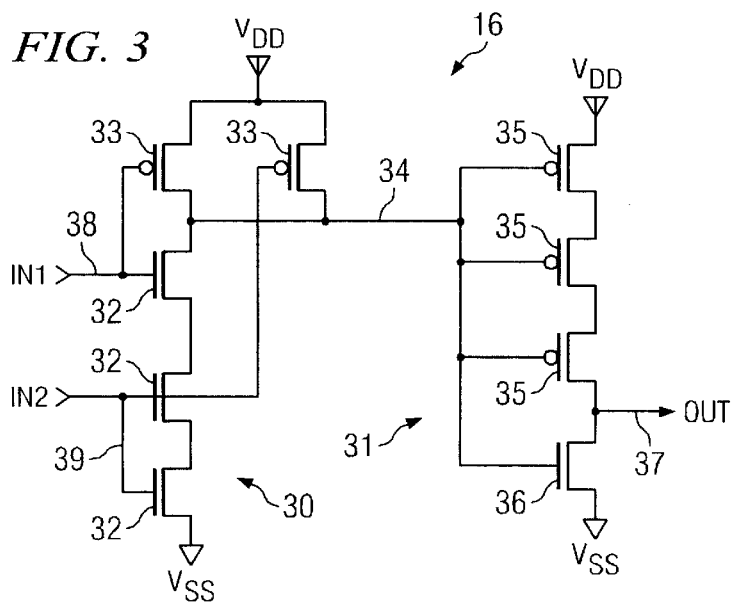
FIG. 3 is a circuit diagram of a delay element according to a preferred embodiment of the present invention.
Figure 4:
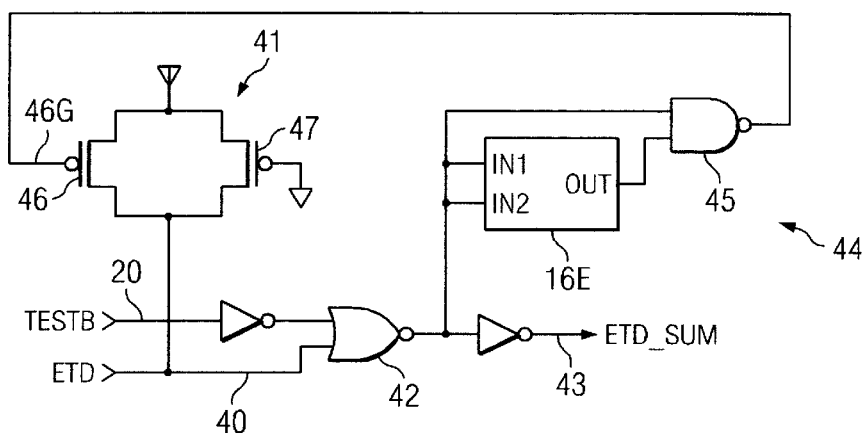
FIG. 4 is a circuit diagram of edge transition detection circuitry in accordance with a preferred embodiment of the present invention.

Signal path 14 includes delay elements 16A and 16B which provide different propagation delay times between a falling edge transition and a rising edge transition appearing on its output. As shown in FIG. 3, delay element 16 comprises a transistor circuit in which current is forced to flow through a stack of series-connected transistors to electrically connect an output to one reference voltage source and at most one transistor to electrically connect the output to a second reference voltage source. By providing two cascaded circuits 30 and 31 which are each configured in this manner, a significant delay differential is created between a delay between an input edge transition to an output rising edge transition and a delay between an input edge transition to an output falling edge transition.

Referring to FIG. 3, circuit 30 of delay element 16. comprises a two input NAND gate in which three pull-down devices 32 are arranged in a stacked relation and two pull-up devices 33 are arranged in a parallel relation. As a result, the falling edge delay for NAND gate output signal 34 is greater that its rising edge delay.

Circuit 31 of delay element 16 comprises an inverter gate having three pull-up devices 35 connected in series with one pull-down device 36. Consequently, the inverter output signal 37 has a rise time delay which is greater than its fall time delay.

As can be seen, delay element 16 comprises a two-input AND gate in which a falling edge transition appearing on either input signal IN1 38 or IN2 39 quickly creates a falling edge transition appearing on output signal OUT 37, and a rising edge transition appearing on either input signal IN1 38 or IN2 39 creates a rising edge transition which is substantially delayed relative to the input rising edge transition.

Figure 2:
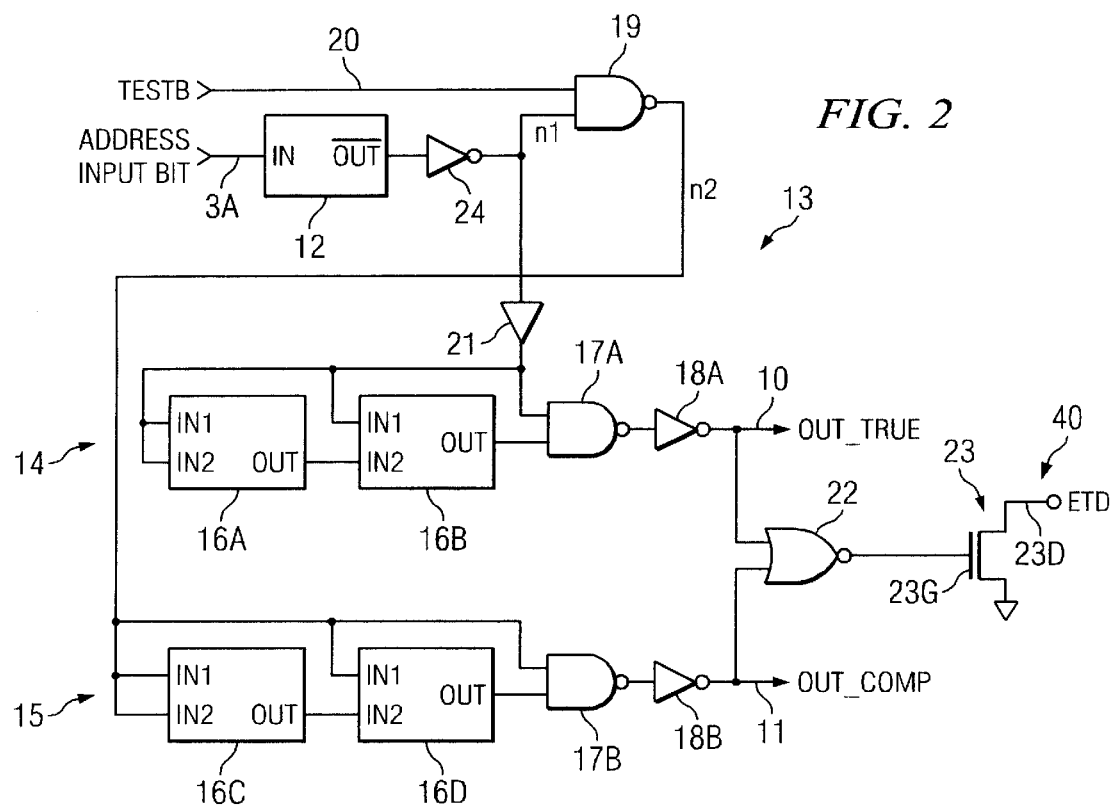
FIG. 2 is a circuit diagram of a preferred embodiment of the present invention.

Referring again to FIG. 2, signal delay path 14, which generates a logical true representation of input address input bit 3A, includes two delay elements 16A and 16B connected in series in which an output of delay element 16A drives an input of delay element 16B. The output of delay element 16B drives a first input of two-input NAND gate 17A, with the second input thereof also being an input into delay elements 16A and 16B. The output of NAND gate 17A is inverted by inverter gate 18A. The combination of delay elements 16A and 16B, NAND gate 17A and inverter 18A as shown in FIG. 2 provides roughly the identical operation as an individual delay element 16, with a primary difference being that the delay to a rising edge transition for the output of inverter 18 (output signal out_true 10) from the input of delay element 16A is over twice as large as the delay to an output signal rising edge transition through an individual delay element 16. As a result, a delay between a rising edge transition appearing on input address bit 3A and a rising edge transition appearing on output signal out_true 10 is substantially greater than the delay between a falling edge transition appearing on input address bit 3A and a falling edge transition appearing on signal out_true 10.

Signal path 15, which is used to generate output signal out_comp 11, is roughly the same as signal path 14 that is used to generate output signal out_true 10, with the exception being signal path 15 includes NAND gate 19 in order to gate input signal TestB 20 (an input signal which preferably configures SRAM 2 into a test mode of operation, such as a stress test mode). A logically non-inverting gate 21, such as a transmission gate, is employed in signal path 14 to substantially equalize the delay through signal paths 14 and 15. As a result, the delay from an edge transition appearing on input address bit 3A to a falling edge transition appearing on signal out_true 10 is substantially the same as the delay from an edge transition appearing on input address bit 3A to a falling edge transition appearing on signal out_comp 11. In addition, the delay from an edge transition appearing on input address bit 3A to a rising edge transition appearing on signal out_true 10 is substantially the same as the delay from an edge transition appearing on input address bit 3A to a rising edge transition appearing on signal out_comp 11.

It is understood that signal paths 14 and 15 may utilize any number of cascaded delay elements 16 in order to create the desired delay differential between the rising and falling edge transition times for output signals out_true 10 and out_comp 11.

Address input buffer 1 further includes an input buffer 12 for receiving. input address input signal 3A. Input buffer 12 may further suitably condition input address input signal 3A in the event the voltage levels for input address input signal 3A do not operatively match the necessary voltage levels for address input buffer circuitry 1.

Output signals out_true 10 and out_comp 11 are described and illustrated as active high signals, which are well suited for address decode circuitry employing NAND decoding gates. It is understood that output signals out_true 10 and out_comp 11 may be configured. as active low signals in order to be suitable for address decode circuitry employing NOR decoding gates.

As stated above, address input buffer 1 may be associated with or be a part of a variety of different devices. In the event that address input buffer 1 is connected to and/or a part of an asynchronous device, such as a SRAM device, address input buffer 1 may preferably include edge detection circuitry to detect an edge appearing on address input bit 3A. The edge detection circuitry, upon detecting an edge transition appearing on address input bit 3A, generates a pulse which initiates a reset and/or initialization operation. In the context of address input buffer 1 being part of an asynchronous SRAM device as shown in FIG. 1, the edge detection circuitry may initiate a memory cycle, including the precharging and equilibrating of the bit lines of bit line pairs, etc.

Address input buffer 1 advantageously utilizes circuitry for generating output signals out_true 10 and out_comp 11 to generate an edge detection pulse. As shown in FIG. 2, edge detection circuitry comprises two-input NOR gate 22 and pull-down device 23. Output signals out_true 10 and out_comp 11 are preferably connected to the input of NOR gate 22, the output of which is connected to the control or gate electrode 23G of pull-down transistor 23. The drain electrode 23D of pull-down transistor 23 (signal ETD 40) may be used in a wired-nor configuration by being connected to other edge transition detection pull-down devices 23 and to a single pull-up device.

In this regard, the present invention preferably further includes a summing circuit 8 (FIG. 4) which is coupled to the drain electrode 23D of pull-down device 23 of each address input buffer circuit 1 and generates a single edge transition detection signal pulse for use in resetting and/or initializing SRAM 2 to commence a memory cycle. Specifically, the drain 23D of pull-down device 23 of each address input buffer circuit 1 is electrically connected together at node 40. Pull-up device 41 is connected to node 40 to provide a wired-nor configuration with pull-down devices 23, such that when any pull-down device 23 is activated node 40 is pulled towards the low reference voltage level. Node 40 is gated with the logical inversion of test signal TestB 20 at NOR gate 42, the output of which is then inverted to generate active low output signal etd_sum 43. Output summing signal etd_sum 43 is the signal which is fed to the SRAM device 2 to initialize SRAM device 2 for the commencement of a memory cycle. Signal etd_sum 43 provides an active low pulse having a pulse width which is defined by the difference in delay between a rising edge transition appearing on output signals out_true 10 and out_comp 11 and a falling edge transition appearing thereon, relative to an edge transition appearing on address input bit 3A.

Summing circuit 8 preferably further includes feedback control circuitry 44 to control the impedance level of pull-up device 41. Feedback control circuitry 44 comprises delay element 16E whose input is connected to the output of NOR gate 42. The output of delay element 16E drives a first input of NAND gate 45 and the output of NOR gate 42 drives a second input thereof. This combination of delay element 16E and NAND gate 45 provides a logically inverted signal of the output of NOR gate 42 in which the rising edge of the output of NAND gate 45 occurs relatively soon after the occurrence of a rising edge transition appearing on the output of NOR gate 42. The falling edge of the output of NAND gate 45 occurs a predetermined time period (as determined by the slowed delay through delay element 16E) after the occurrence of a rising edge transition appearing on the output of NOR gate 42.

Pull-up device 41 of summing circuit 8 preferably comprises p-channel transistor 46 and p-channel transistor 47 connected in parallel. Pull-up transistor 47 is preferably sized and biased so as to relatively weakly pull node 40 towards the high reference voltage level. The gate electrode 46G of pull-up transistor 46 is driven by the output of NAND gate 45. By providing feedback to pull-up device 41 with a delayed falling edge transition on gate electrode 46G of pull-up transistor 46, pull-up transistor 46 is activated a period of time following a falling edge transition appears on signal ETD 40. This delayed activation of pull-up transistor 46 reduces crowbar current during the occurrence of a pulse appearing on signal ETD 40 while providing a relatively sharp rising edge thereon.

Figure 5:
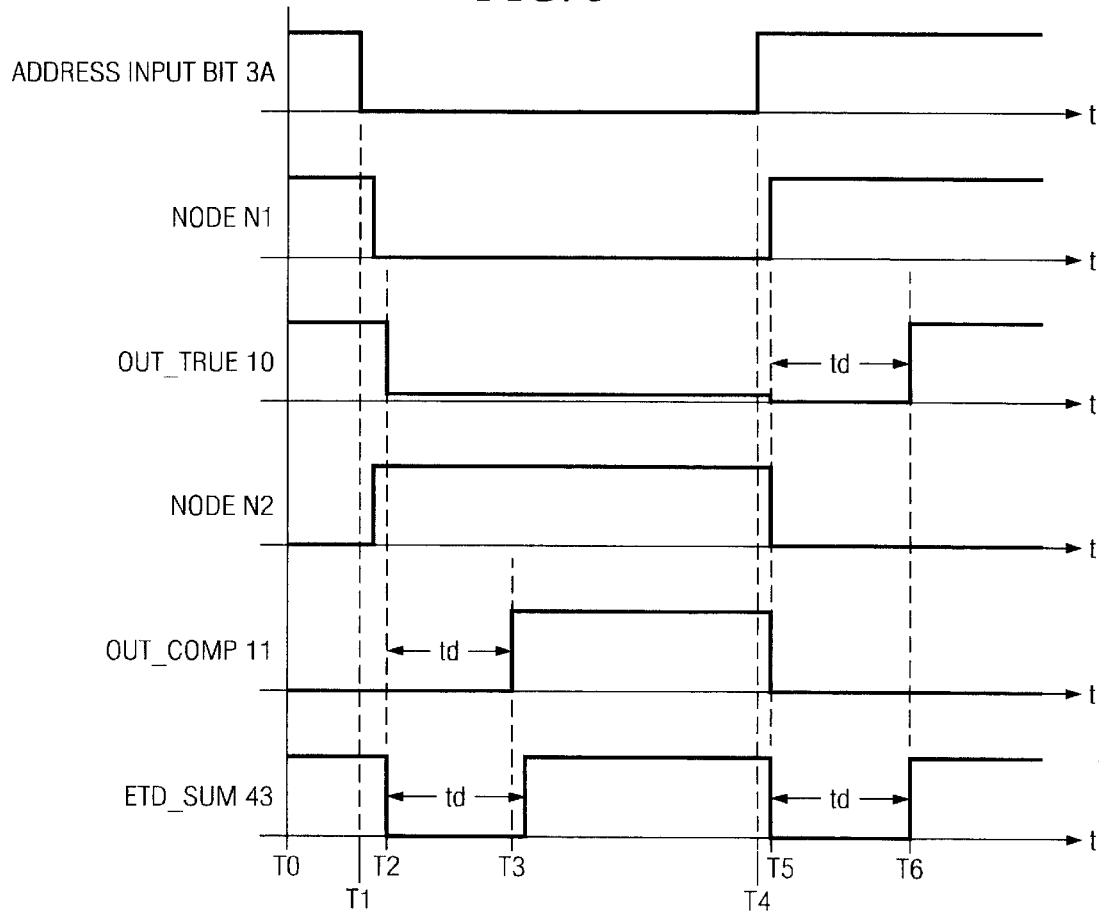
FIG. 5 is a timing diagram illustrating the operation of the present invention.

The operation of address input buffer circuit 1 is as follows. Consider the case wherein a high logic level was previously placed on address input bit 3A at time T0. As shown in FIG. 5, node ni (output of inverter 24) is driven to a high logic level, which is propagated through delay elements 16A and 16B, NAND gate 17A and inverter 18A so that output signal out_true 10 is driven to a high logic level. Similarly, node n2 (output of NAND gate 19) is driven to a low logic level, which is propagated through delay elements 16C and 16D, NAND gate 17B and inverter 18B so that output signal out_comp 11 is driven to a low logic level. With output signal out_true 10 being at a high logic level, signal ETD 40 is capable of being pulled towards the high reference voltage supply by pull-up device 41.

When address input bit 3A transitions to a low logic level at time T1, node n1 then transitions from a high logic level to a low logic level and node n2 transitions from a low logic level to a high logic level. With respect to signal path 14, node nl transitioning to the low logic level quickly forces the output of NAND gate 17A to the high logic level, after which out_true 10 is driven to the-low logic level at time T2. The output signals of delay elements 16A and 16B are driven to the low logic level fairly quickly after node nl is driven to the low logic level. However, because the output of NAND gate 17A was already driven to the high logic level, the signal propagating through delay elements 16A and 16B has no effect on the transitioning of output signal out_true 10. Soon after output signal out_true 10 is driven to the logic low level, the output of NOR gate 22 is driven to a logic high state which activates pull-down transistor 23, thereafter causing output signal etd_sum 43 to also fall towards the low reference voltage level shortly after time T2.

With respect to signal path 15, node N2 transitioning from a low reference level to a high reference voltage level places one input of NAND gate 17B in a logic high state. The rising edge transition of node N2 passes through delay elements 16C and 16D before appearing on the second input of NAND gate 17B. Because of the delay for an output signal rising edge transition for delay elements 16C and 16D, the second input of NAND gate 17B does not transition to a high logic level until an appreciable period of time has elapsed. Eventually, the second input of NAND gate 17B transitions to a high logic level, which causes the output of NAND gate 17B to be driven to the low logic level, after which output signal out_comp 11 is driven to a high logic level at time T3. The effect of delay elements 16 having a fast falling edge delay and a slower rising edge delay,is seen in FIG. 5 by the falling edge of signal out_true 10 occurring time period td (equaling the time difference between time T3 and time T2) earlier than the rising edge of signal out comp 11, in response to an edge transition appearing on address input bit 3A. Soon after time T3, the output of NOR gate 22 is driven towards the low reference voltage level, which deactivates pull-down transistor 23 and causes signal ETD 40 and etd_sum 43 to be driven towards the low reference voltage.

Consider further the case in which address input bit 3A transitions from a low logic level to a high logic level at time T4. Address input bit 3A transitioning from a low logic level to a high logic level causes a falling transition on node N2. The falling transition on node N2 quickly drives the output of NAND gate 17B to a high logic level, after which output out_comp 11 is driven to a low logic level at time T5. Shortly thereafter, signal ETD 40 and signal etd_sum 43 are driven to the low logic level.

Node N1, after the rising edge transition of address input bit 3A propagates through input circuit 12, inverter 24 and non-inverting buffer 21, transitions from a low logic level to a high logic level. The rising edge transition of node n1 appears on a first input of NAND gate 17A. However, the rising transition of node n1 relatively slowly propagates through delay elements 16A and 16B such that a rising edge transition does not appear on the second input of NAND gate 17A until noticeably later, after which the output of NAND gate 17A transitions to the low logic level followed by output signal out_true 10 having a rising edge transition at time T6. With output signal out_true 10 at the high voltage level, signals ETD 40 and etd_sum 43 are driven to the logic high state shortly after time T6.

As can be seen from FIG. 5, an edge transition appearing on address input bit 3A, in either direction, causes both output signals out_true 10 and out_comp 11 to be placed in a deasserted state (the low logic level, in this example) for time period td, until the appropriate output signal out_true 10 or out_comp 11 later transitions to the asserted state (the high logic level). An output signal transitioning to the asserted state only after the predetermined period of time td elapses during which both output signals out_true 10 and out_comp 11 are placed in a deasserted state advantageously prevents any relatively narrow glitches appearing on address input bit 3A from propagating through address input buffer 1 to output signals out_true 10 and out_comp 11. Address input buffer 1 thus prevents a false address selection which could otherwise cause glitches on a wordline of a connected asynchronous SRAM, leading to data stored in memory cells being inadvertently overwritten, or multiple selection of a number of wordlines as the new address appearing at address input bus 3 propagates through address decoders 4 and 5. Similarly, address input buffer 1 prevents the pulse appearing on signals ETD 40 and etd sum 43 from being shortened or eliminated due to any relatively narrow glitches occurring on address input bit 3A. Signals ETD 40 and etd_sum 43 thus are active low pulses each having a pulse width of time td (the time period in which both out_true 10 and out_comp 11 are in the deasserted logic state).

In addition, decoupling the edge transitions of output signals out_true 10 and out_comp 11 reduces the magnitude of any dynamic current spike which is produced when the CMOS circuits generating signals out_true 10 and out-comp 11 as well as other CMOS circuitry driven thereby switch states. Moreover, the delay through address input buffer 1 provides adequate address hold time at the completion of a memory write operation when address input buffer 1 is part of an SRAM device. Because the edge detection circuitry of the present invention employs a substantial amount of circuitry which generates output signals out_true 10 and out_comp 11, layout overhead is substantially minimized.

Although the preferred embodiment of the present invention has been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. An address input buffer device for an asynchronous device, comprising:

a first circuit for receiving an address bit signal;

a second circuit, responsive to the first circuit, for generating a logic true signal of the address bit signal received by the first circuit and a logic complement signal of the address bit signal received by the first circuit, wherein a signal transition of the logic true signal is spaced in time from a signal transition of the logic complement signal, the second circuit includes timing circuitry to place the logic true signal and the logic complement signal in the same deasserting logic state for a predetermined period of time following the address bit signal transitioning between logic states;

an edge detection circuit for generating a pulse signal that is asserted during the time the logic true signal and the logic complement signal are in the same deasserting logic state; and a summing circuit including at least one pull-down device, each pull-down device being activated by a logic true signal and corresponding logic complement signal generated by a distinct second circuit, an output node of the at least one pull-down device being connected to a pull-up device, an impedance level of the pull-up device being varied between at least two finite values when activated based upon a signal level of the output node.

2. The device of claim 1, wherein:

the timing circuitry includes a first delay element responsive to the first circuit for generating the logic true signal and a second delay element responsive to the first circuit for generating the logic complement signal, the first delay element and the second delay element each having an input and an output whose falling edge is delayed by a first delay time relative to a transition on the input and whose rising edge is delayed by a second delay time relative to a transition on the input, and wherein the second delay time is substantially larger than the first delay time.

3. The device of claim 1, wherein:

the timing circuitry causes the logic true signal to transition towards a first logic state and a second logic state in response to the address bit signal transitioning towards the first logic state and the second logic state, respectively;

the transition of the logic true signal towards the first logic state is delayed by a first delay time relative to the transition of the address bit signal towards the first logic state, and the transition of the logic true signal towards the second logic state is delayed by a second delay time relative to the transition of the address bit signal towards the second logic state; and the first delay time is substantially larger than the second delay time.

4. The device of claim 3, wherein:

the timing circuitry causes the logic complement signal to transition towards the first logic state and the second logic state in response to the address bit signal transitioning towards the second logic state and the first logic state, respectively; and the transition of the logic complement signal towards the first logic state is delayed by a third delay time relative to the transition of the address bit signal towards the second logic state, and the transition of the logic complement signal towards the second logic state is delayed by a fourth delay time relative to a transition of the address bit signal towards the first logic state; and the third delay time is substantially larger than the fourth delay time.

5. The device of claim 4, wherein:

the first delay time is substantially the same as the third delay time; and the second delay time is substantially the same as the fourth delay time.

6. The device of claim 1, further including:

a plurality of first circuits and second circuits, each first circuit and second circuit being associated with a distinct address bit signal; and an edge detection circuit for generating a pulse signal upon detection of signal transitions by a logic true signal and a corresponding logic complement signal of a second circuit associated with an address bit signal.

7. The device of claim 6, wherein:

the edge detection circuit includes a plurality of pull-down devices, each pull-down device being activated by a logic true signal and corresponding logic complement signal generated by a distinct second circuit, an output node of the pull-down devices being connected together, and a pull-up device connected to the pull-down devices so as to form a wired-nor configuration.

8. The device of claim 6, wherein:

a drive strength of the pull-up device is varied based upon a signal level of the output node of the pull-down devices.

9. A method for buffering an address input signal for an asynchronous circuit, comprising the steps of:

receiving the address input signal;

generating a logic true signal representation of the address input signal and a logic complement signal representation thereof;

separating in time signal transitions of the logic true signal representation from signal transitions of the logic complement signal representation during the step of generating, including the step of temporarily placing the logic true signal representation and the logic complement signal representation in the same logic state following a signal transition appearing on the address input signal;

generating an edge transition detection pulse during the step of temporarily placing, the edge detection pulse having a pulse width approximately equaling the time the logic true signal representation and the logic complement signal representation are in the same logic state; and generating a summing signal based upon the edge transition detection pulse, wherein when the summing signal transitions to a logic level indicative of an absence of an edge transition detection pulse, the summing signal is pulled to a reference voltage with a first impedance value and then with a second impedance level a period of time thereafter.

10. The method of claim 9 wherein:

the step of separating includes the steps of transitioning the logic true signal towards a first logic state a first time delay following the address input signal transitioning towards the first logic state, and transitioning the logic true signal towards a second logic state a second time delay following the address input signal transitioning towards the second logic state; and the first delay time is substantially greater than the second delay time.

11. The method of claim 10, wherein:

the step of separating includes the steps of transitioning the logic complement signal towards a first logic state a third time delay following the address input signal transitions towards the second logic state, and transitioning the logic complement signal towards a second logic state a fourth time delay following the address input signal transitions towards the first logic state; and the third delay time is substantially greater than the fourth delay time.

12. The method of claim 11, wherein:

the first time delay is substantially the same as the third time delay; and the second time delay is substantially the same as the fourth time delay.

13. The method of claim 9, wherein:

the step of separating further includes the step of placing either the logic true signal representation or the logic complement signal representation in a logic state which selects an activity, following the step of temporarily placing the logic true signal representation and logic complement signal representation in a same deasserting logic state.

14. The method of claim 9, further including the steps of:

detecting a signal transition on the address input signal responsive to the step of generating; and generating an edge transition detection pulse responsive to the step of detecting a signal transition.

15. An input buffering circuit for an asynchronous device, comprising:

a means for receiving an input signal; and a first signal generating means, responsive to the means for receiving, for generating a logic true signal representation of the input signal and a logic complement signal representation of the input signal, wherein the logic true and logic complement signal representations are initially placed into the same logic state following an edge transition appearing on the input signal;

a second signal means for detecting an edge transition appearing on the input signal and generating a pulse signal that is asserted during the time the- logic true and logic complement signal representations are in the same logic state; and a third signal means responsive to the second signal means for generating an output signal based upon the pulse signal, the output signal having a first output impedance level following transition to a logic level indicative of an absence of the pulse signal and a second output impedance level a predetermined period of time thereafter while in the logic level indicative of an absence of the pulse signal.

16. The circuit of claim 11, wherein:

a delay between a rising edge transition on the input signal and a rising edge transition on the logic true signal is substantially the same as the delay between a falling edge transition on the input signal and a rising edge transition on the logic complement signal, a delay between a falling edge transition on the input signal and a falling edge transition on the logic true signal is substantially the same as the delay between a rising edge transition on the logic true signal and a falling edge transition on the logic complement signal; and the delay to a rising edge transition appearing on the logic true signal is substantially greater than the delay to a falling edge transition on the logic true signal.

17. The circuit of claim 16, wherein:

the first signal generating means includes a first delay element for generating the logic true signal and a second delay element for generating the logic complement signal, the first delay element and the second delay element each having an input and an output whose falling edge is delayed by a first delay time relative to a transition on the input and whose rising edge is delayed by a second delay time relative to a transition on the input, and wherein the second delay time is substantially larger than the first delay time.

18. The circuit of claim 15, wherein:

the first signal generating means places the logic true signal and the logic complement signal in the same deasserting logic state for a predetermined period of time prior to placing one of the logic true signal and the logic complement signal in an asserting logic state.

19. The circuit of claim 15, further including:

a second signal generating means for detecting an edge transition appearing on the input signal and for generating a pulse responsive to the detection, the second signal generating means being responsive to a rising edge transition and a falling edge transition appearing on the logic true signal and the logic complement signal.

20. An asynchronous device, comprising:

an address input buffer for receiving an input address bus and generating logic true and logic complement signals of each address input signal of the input address bus, wherein a signal transition appearing on a logic true signal is separated in time from a signal transition appearing on a corresponding logic complement signal; and decode logic for receiving the logic true and logic complement signals of the address input buffer and asserting at least one of a plurality of decode output signals based upon a value of the logic true and logic complement signals;

control circuitry responsive to the logic true and logic complement signals for generating a control signal having a logic value based upon the presence of transitions appearing on the logic true and logic complement signals, the control circuitry having a pull-up or pull-down device coupled to the control signal and providing a first impedance level initially when in a logic state indicative of an absence of the transitions, and a second impedance level a predetermined period of time thereafter when in the logic state indicative of an absence of the transitions; and circuitry for performing an operation responsive to a decode output signal being asserted.

21. The asynchronous device of claim 20, wherein:

the circuitry comprises a memory cell array organized into a plurality of rows of memory cells, each row of memory cells being coupled to a word line that is driven by a distinct decode output signal.

22. The asynchronous device of claim 20, wherein:

each logic true signal and corresponding logic complement signal are placed in the same logic state for a predetermined period of time following the corresponding address input signal transitioning between logic states; and the address input buffer comprises edge detection circuitry for generating a pulse signal that is asserted during the time when a logic true signal and corresponding logic complement signal are substantially simultaneously in the same logic state.

23. The address input buffer of claim 1, wherein the at least one pull-up device comprises a first transistor coupled between the output node and a reference voltage and being substantially continuously activated, and a second transistor coupled between the output node and the reference voltage and being activated by the summing circuit a predetermined period of time following the output node transitioning to a high logic level.

24. The input buffering circuit of claim 17, wherein third signal means comprises a pull-up or, pull-down device comprising a first transistor coupled between the output signal and a reference voltage and being substantially continuously activated, and a second transistor coupled between the output signal and the reference voltage and being activated by the third signal means a predetermined period of time following the output signal transitioning to the logic level indicative of an absence of the pulse signal.

25. The asynchronous device of claim 20, wherein the pull-up or pull-down device comprises a first transistor coupled between the control signal and a reference voltage and being substantially continuously activated, and a second transistor coupled between the control signal and the reference voltage and being activated by the summing circuit a predetermined period of time following the control signal transitioning to a logic level indicative of an absence of transitions appearing on the logic true and logic complement signals.

* * * * *

UNITED STATES PATENT AND TRADEMARK OFFICE
CERTIFICATE OF CORRECTION

PATENT NO. : 6,603,338 B1
DATED : August 5, 2003
INVENTOR(S) : David C. McClure

It is certified that error appears in the above-identified patent and that said Letters Patent is hereby corrected as shown below:

Column 1,
Lines 18-19, replace "are typically designed synchronous" with -- are typically designed to operate in response to input signals in either a synchronous --

Column 3,
Lines 2-3, replace "asshown" with -- as shown --
Line 41, replace "pulse width" with -- pulsewidth --

Column 5,
Line 62, replace "pulse width" with -- pulsewidth --

Column 6,
Line 34, replace "node ni" with -- node n1 --

Column 7,
Line 10, replace "delay, is seen" with -- delay is seen --
Line 13, replace "out comp 11" with -- out_comp 11 --
Line 61, replace "etd sum 43" with -- etd_sum 43 --
Line 65, replace "pulse width" with -- pulsewidth --

Column 10,
Line 1, replace "pulse width" with -- pulsewidth --
Line 64, replace "the-logic" with -- the logic --

Column 12,
Line 40, replace "pull-up or, pull-down" with -- pull-up or pull-down --

Signed and Sealed this

Thirtieth Day of December, 2003

JAMES E. ROGAN
*Director of the United States Patent and Trademark Office*